United States Patent
Noh

(10) Patent No.: US 11,164,821 B2
(45) Date of Patent: Nov. 2, 2021

(54) SEMICONDUCTOR PACKAGE

(71) Applicant: SAMSUNG ELECTRONICS CO., LTD., Suwon-si (KR)

(72) Inventor: Boin Noh, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 16 days.

(21) Appl. No.: 16/853,910

(22) Filed: Apr. 21, 2020

(65) Prior Publication Data

US 2021/0151380 A1    May 20, 2021

(30) Foreign Application Priority Data

Nov. 14, 2019   (KR) .................. 10-2019-0146170

(51) Int. Cl.
*H01L 23/495*  (2006.01)
*H01L 23/538*  (2006.01)
(Continued)

(52) U.S. Cl.
CPC ...... *H01L 23/5389* (2013.01); *H01L 21/4853* (2013.01); *H01L 21/4857* (2013.01); *H01L 21/565* (2013.01); *H01L 21/568* (2013.01); *H01L 21/6835* (2013.01); *H01L 23/3128* (2013.01); *H01L 23/367* (2013.01); *H01L 23/5383* (2013.01); *H01L 23/5386* (2013.01); *H01L 24/19* (2013.01); *H01L 24/20* (2013.01); *H01L 2221/68372* (2013.01); *H01L 2224/214* (2013.01); *H01L 2224/2105* (2013.01); *H01L 2924/3512* (2013.01)

(58) Field of Classification Search
CPC ............. H01L 21/4853; H01L 21/4857; H01L 21/565; H01L 21/568; H01L 21/6835; H01L 23/3128; H01L 23/367; H01L 23/5383; H01L 23/5386; H01L 23/5389; H01L 24/19; H01L 24/20
USPC ....................................................... 257/668
See application file for complete search history.

(56) References Cited

U.S. PATENT DOCUMENTS 6,415,974 B2   7/2002  Jao
7,507,655 B2   3/2009  Sakaguchi et al.
(Continued)

FOREIGN PATENT DOCUMENTS

JP          2019-67991 A     4/2019

*Primary Examiner* — Luan C Thai
(74) *Attorney, Agent, or Firm* — Lee IP Law, P.C.

(57) ABSTRACT

A semiconductor package including a semiconductor chip having a chip pad thereon; a first insulating layer; a redistribution line pattern on the first insulating layer; a redistribution via pattern through the first insulating layer to connect the chip pad to the redistribution line pattern; a second insulating layer covering the redistribution line pattern and including a first part having a first thickness and a second part having a second thickness. the second part being inward relative to the first part; a first conductive pillar through the first part and connected to the redistribution line pattern; a second conductive pillar through the second part and connected to the redistribution line pattern; a first connection pad on the first conductive pillar; a second connection pad on the second conductive pillar; a first connection terminal contacting the first connection pad; and a second connection terminal contacting the second connection pad.

20 Claims, 9 Drawing Sheets

(51) Int. Cl.
*H01L 23/367* (2006.01)
*H01L 23/00* (2006.01)
*H01L 21/683* (2006.01)
*H01L 21/48* (2006.01)
*H01L 21/56* (2006.01)
*H01L 23/31* (2006.01)

(56) References Cited

U.S. PATENT DOCUMENTS

| | | |
|---|---|---|
| 7,727,877 B2 | 6/2010 | Kang et al. |
| 8,435,834 B2 | 5/2013 | Pagaila et al. |
| 8,686,560 B2 | 4/2014 | Parvarandeh et al. |
| 9,000,540 B2 * | 4/2015 | Sunamura ............ H01L 27/124 |
| | | 257/411 |
| 9,111,947 B2 | 8/2015 | O'Sullivan et al. |
| 10,629,558 B2 * | 4/2020 | Lu ........................ H01L 23/481 |
| 2019/0172793 A1 * | 6/2019 | Kim ..................... H01L 21/563 |

* cited by examiner

SEMICONDUCTOR PACKAGE

CROSS-REFERENCE TO RELATED APPLICATION

Korean Patent Application No. 10-2019-0146170, filed on Nov. 14, 2019, in the Korean Intellectual Property Office, and entitled: "Semiconductor Package," is incorporated by reference herein in its entirety.

BACKGROUND

1. Field

Embodiments relate to a semiconductor package.

2. Description of the Related Art

A semiconductor package may be mounted on a system board and used.

SUMMARY

The embodiments may be realized by providing a semiconductor package including a semiconductor chip having a first surface that includes a chip pad thereon; a first insulating layer covering the first surface; a redistribution line pattern on the first insulating layer; a redistribution via pattern passing through the first insulating layer to connect the chip pad to the redistribution line pattern; a second insulating layer covering the redistribution line pattern on the first insulating layer, the second insulating layer including a first part having a first thickness and a second part having a second thickness greater than the first thickness, the second part being disposed inwardly in the semiconductor package relative to the first part; a first conductive pillar passing through the first part of the second insulating layer and connected to the redistribution line pattern; a second conductive pillar passing through the second part of the second insulating layer and connected to the redistribution line pattern; a first connection pad on the first conductive pillar; a second connection pad on the second conductive pillar; at least one first connection terminal in contact with the first connection pad and having a first size; and a second connection terminal in contact with the second connection pad and having a second size that is smaller than the first size.

The embodiments may be realized by providing a semiconductor package including a semiconductor chip having a first surface that includes a chip pad thereon; a first insulating layer covering the first surface; a redistribution line pattern on the first insulating layer; a redistribution via pattern passing through the first insulating layer to connect the chip pad to the redistribution line pattern; a second insulating layer covering the redistribution line pattern on the first insulating layer and including a first part having a first thickness, a second part having a second thickness greater than the first thickness, and a third part having a third thickness greater than the second thickness, the second part being disposed inwardly in the semiconductor package relative to the first part, and the third part being disposed inwardly in the semiconductor package relative to the second part; a first conductive pillar passing through the first part of the second insulating layer and connected to the redistribution line pattern; a second conductive pillar passing through the second part of the second insulating layer and connected to the redistribution line pattern; and a third conductive pillar passing through the third part of the second insulating layer and connected to the redistribution line pattern.

The embodiments may be realized by providing a semiconductor package including a semiconductor chip having a first surface that includes a chip pad thereon; a first insulating layer covering the first surface; a redistribution line pattern on the first insulating layer; a redistribution via pattern passing through the first insulating layer to connect the chip pad to the redistribution line pattern; a second insulating layer covering the redistribution line pattern on the first insulating layer, the second insulating layer including a first part having a first thickness and a second part having a second thickness greater than the first thickness, the second part being disposed inwardly in the semiconductor package relative to the first part; a first conductive pillar passing through the first part of the second insulating layer and connected to the redistribution line pattern; and a second conductive pillar passing through the second part of the second insulating layer and connected to the redistribution line pattern.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
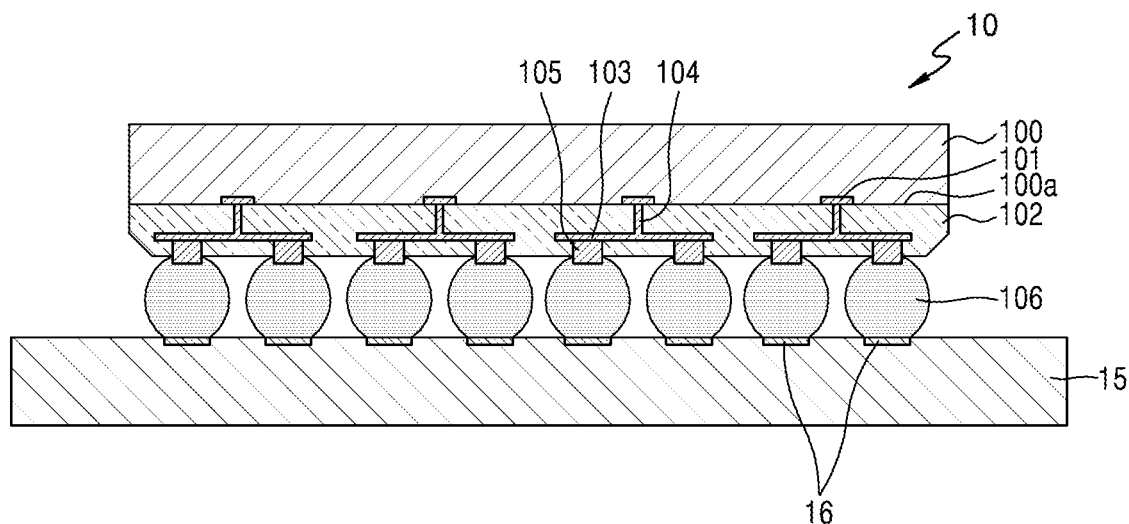
FIG. 1 is a cross-sectional view of a system board and a semiconductor package mounted thereon, according to a comparative example.

In the specification, a thickness of a component in the embodiments may be defined as a length in a vertical direction (V direction of the drawing figures), and a width thereof may be defined as a length in a horizontal direction (H direction in the drawing figures).

FIG. 1 is a cross-sectional view of a system board 15 and a semiconductor package 10 mounted thereon, according to a comparative example.

Referring to FIG. 1, the semiconductor package 10 according to a comparative example may include a semiconductor chip 100 having a chip pad 101, an insulating layer 102, a redistribution line pattern 103, a redistribution via pattern 104, a conductive pillar 105, and a connection terminal 106.

The semiconductor package 10 may be mounted on the system board 15. The connection terminal 106 of the semiconductor package 10 may come in contact with a board pad 16 of the system board 15, and the chip pad 101 of the semiconductor package 10 may be electrically connected to the system board 15 through the connection terminal 106.

A plurality of connection terminals 106 of the semiconductor package 10 may have the same size. For example, the plurality of connection terminals 106 of the semiconductor package 10 may have the same volume.

When the semiconductor package 10 is used by being mounted on the system board 15, cracks may occur on the connection terminal 106 of the semiconductor package 10 due to a difference in a coefficient of thermal expansion (CTE) between the semiconductor package 10 and the system board 15.

For example, connection terminals 106 at an edge (e.g., outer) part of the semiconductor package 10 may be more vulnerable to heat than connection terminals 106 at a center (e.g., inner) part of the semiconductor package 10. Accordingly, cracks may frequently occur on the connection terminals 106 at the edge part of the semiconductor package 10.

Semiconductor packages 20, 30, 40, 50, 60, and 70 according to embodiments will be described in more detail below.

Figure 2:
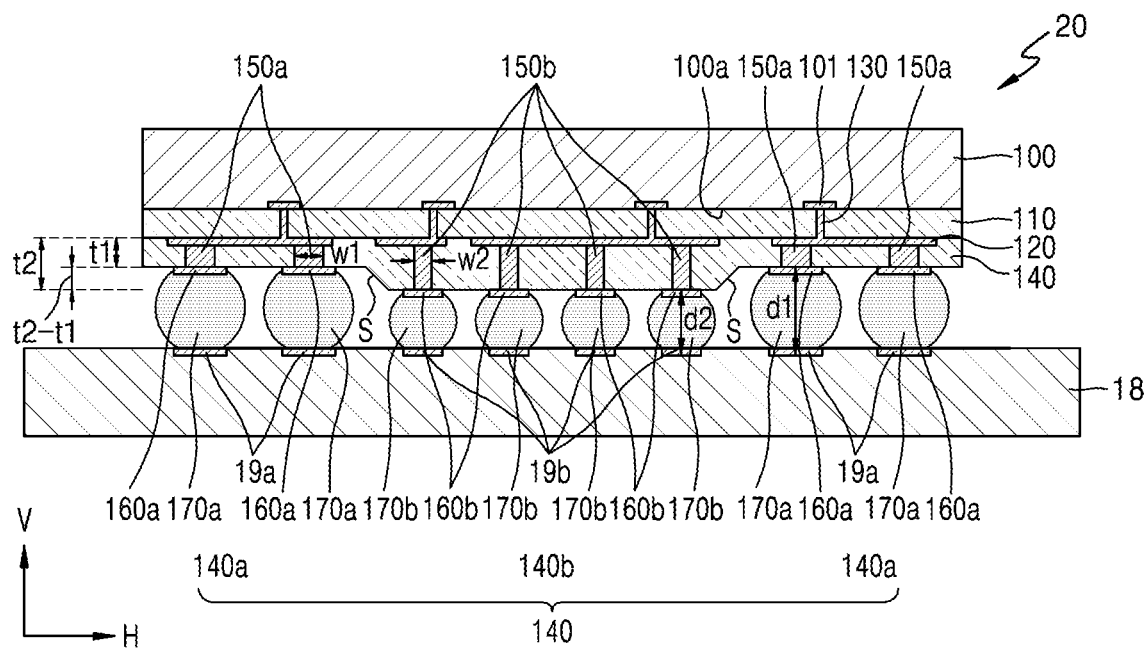
FIGS. 2 to 7 are cross-sectional views of semiconductor packages according to embodiments.

FIG. 2 is a cross-sectional view of the semiconductor package 20 according to an embodiment.

Referring to FIG. 2, the semiconductor package 20 according to an embodiment may include the semiconductor chip 100, a first insulating layer 110, a redistribution line pattern 120, a redistribution via pattern 130, a second insulating layer 140, a first conductive pillar 150a, a second conductive pillar 150b, a first connection pad 160a, a second connection pad 160b, a first connection terminal 170a, and a second connection terminal 170b. The semiconductor package 20 may be a fan-in semiconductor package, and a foot-print occupied by the semiconductor chip 100 may be substantially the same as a foot-print of the semiconductor package 20.

The semiconductor chip 100 may include a memory semiconductor chip. The memory semiconductor chip may include, e.g., a volatile memory semiconductor chip such as dynamic random access memory (DRAM) or static random access memory (SRAM) or a nonvolatile memory semiconductor chip such as phase-change random access memory (PRAM), magneto-resistive random access memory (MRAM), ferroelectric random access memory (FRAM), or resistive random access memory (RRAM).

In an implementation, the semiconductor chip 100 may include a logic semiconductor chip. The logic semiconductor chip may include, e.g., a central processing unit (CPU), a micro processing unit (MPU), a graphics processing unit (GPU), or an application processor (AP).

In an implementation, the semiconductor chip 100 may include silicon (Si). In an implementation, the semiconductor chip 100 may include a semiconductor element such as germanium (Ge), or a compound semiconductor such as silicon carbide (SiC), gallium arsenide (GaAs), indium arsenide (InAs), or indium phosphide (InP). As used herein, the term "or" is not an exclusive term, e.g., "A or B" would include A, B, or A and B. The semiconductor chip 100 may have an active surface and an inactive surface opposite to the active surface, and the active surface may be formed at a part adjacent to a first surface 100a.

The semiconductor chip 100 may include various kinds of multiple individual devices on the active surface. The multiple individual devices may include various micro electronic devices, e.g., a complementary metal-oxide-semiconductor (CMOS) transistor, a metal-oxide-semiconductor filed effect transistor (MOSFET), a system large scale integration (LSI), an image sensor such as a CMOS imaging sensor, a micro-electro-mechanical system (MEMS), an active device, a passive device, or the like.

The semiconductor chip 100 may have the chip pad 101 on the first surface 100a. The chip pad 101 may be electrically connected to the various kinds of multiple individual devices described above.

In an implementation, the first insulating layer 110 may be on or cover the first surface 100a of the semiconductor chip 100. In an implementation, the first insulating layer 110 may cover the first surface 100a of the semiconductor chip 100 and have a thickness (e.g., in the vertical direction V) of approximately 2 µm to approximately 100 µm, e.g., a thickness of approximately 3 µm to approximately 50 µm.

The first insulating layer 110 may include an insulating material. In an implementation, the first insulating layer 110 may include an organic compound such as a polymer material. In an implementation, the first insulating layer 110 may include an insulating material such as a photo imageable dielectric (PID) material on which a photolithography process is possible. In an implementation, the first insulating layer 110 may include a photosensitive polyimide (PSPI) or polybenzobisoxazole (PBO).

In an implementation, the redistribution line pattern 120 may be on the surface of the first insulating layer 110. The redistribution line pattern 120 may be connected to the chip pad 101 of the semiconductor chip 100 through the redistribution via pattern 130 to be described below.

In an implementation, the redistribution via pattern 130 may pass through the first insulating layer 110 to connect the chip pad 101 to the redistribution line pattern 120.

In an implementation, the semiconductor package 20 may include a seed layer. The seed layer may be between the redistribution line pattern 120 and the first insulating layer 110 and between the redistribution via pattern 130 and the first insulating layer 110.

The seed layer may be formed through a physical vapor deposition process, and the redistribution line pattern 120 and the redistribution via pattern 130 may be formed through a plating process.

The seed layer may include copper (Cu), titanium (Ti), titanium tungsten (TiW), titanium nitride (TiN), tantalum (Ta), tantalum nitride (TaN), chromium (Cr), aluminum (Al), or combinations thereof. In an implementation, the seed layer may include Cu/Ti in which Cu is stacked on Ti or Cu/TiW in which Cu is stacked on TiW.

In an implementation, the redistribution line pattern 120 and the redistribution via pattern 130 may include, e.g., a metal such as Cu, Al W, Ti, Ta, indium (In), molybdenum (Mo), manganese (Mn), cobalt (Co), tin (Sn), nickel (Ni), magnesium (Mg), rhenium (Re), beryllium (Be), gallium (Ga), ruthenium (Ru), or an alloy thereof.

In an implementation, when Cu is used as a material of the redistribution line pattern 120, the redistribution via pattern 130, and the seed layer, at least a portion of the seed layer may function as a diffusion barrier layer.

In an implementation, the second insulating layer 140 may cover the redistribution line pattern 120 on the first insulating layer 110. The second insulating layer 140 may include an insulating material. In an implementation, the second insulating layer 140 may include an organic compound such as a polymer material. In an implementation, the second insulating layer 140 may include an insulating material such as a PID material on which a photolithography process is possible. In an implementation, the second insulating layer 140 may include PSPI or PBO.

In an implementation, the second insulating layer 140 may include a first part 140a having a first thickness t1 and a second part 140b having a second thickness t2.

In an implementation, the first part 140a may be a part of the second insulating layer 140 having the first thickness t1 around an edge (e.g., at an outer side) of the semiconductor package 20. The second part 140b may be a part of the second insulating layer 140 located further inside than the first part 140a (e.g., may be on an inner side of the second part) and having the second thickness t2 greater than the first thickness t1.

In an implementation, the first thickness t1 of the first part 140a may be approximately 3 μm to approximately 50 μm. In an implementation, the second thickness t2 of the second part 140b may be greater than the first thickness t1 of the first part 140a, e.g., may be approximately 3 μm to approximately 200 μm. In an implementation, the first thickness t1 of the first part 140a may be approximately 10 μm, and the second thickness t2 of the second part 140b may be approximately 60 μm.

Due to a thickness difference (t2−t1) between the first part 140a and the second part 140b of the second insulating layer 140, the second insulating layer 140 may include a stepped part. In an implementation, the thickness difference (t2−t1) between the first part 140a and the second part 140b of the second insulating layer 140 may be approximately 1 μm to approximately 50 μm.

In an implementation, as shown in FIG. 2, a boundary surface S between the first part 140a and the second part 140b may be inclined, and the second insulating layer 140 may have a stair shape at a boundary between the first part 140a and the second part 140b. In an implementation, the boundary surface S between the first part 140a and the second part 140b may not be inclined.

In an implementation, the thickness difference (t2−t1) between the first part 140a and the second part 140b of the second insulating layer 140 may be substantially the same as a thickness difference (d1−d2) between the first connection terminal 170a and the second connection terminal 170b to be described below. Accordingly, a lowermost end of the first connection terminal 170a and a lowermost end of the second connection terminal 170b may be at substantially the same level L (see FIG. 3). For example, lowermost ends of the first connection terminal 170a and the second connection terminal 170b may be a same distance from the semiconductor chip 100 in the vertical direction V.

In an implementation, the first conductive pillar 150a may pass through the first part 140a of the second insulating layer 140 to connect the redistribution line pattern 120 to the first connection pad 160a. The second conductive pillar 150b may pass through the second part 140b of the second insulating layer 140 to connect the redistribution line pattern 120 to the second connection pad 160b.

In an implementation, a material of the first conductive pillar 150a and the second conductive pillar 150b may be the same as a material of the redistribution line pattern 120 and the redistribution via pattern 130 described above. In an implementation, the material of the first conductive pillar 150a and the second conductive pillar 150b may be substantially the same as the material of the redistribution line pattern 120 and the redistribution via pattern 130.

In an implementation, the semiconductor package 20 may further include a seed layer between the first conductive pillar 150a and the first part 140a of the second insulating layer 140 and between the second conductive pillar 150b and the second part 140b of the second insulating layer 140. The seed layer may be the same as that described above.

In an implementation, a thickness of the first conductive pillar 150a (e.g., a vertical length of the first conductive pillar 150a in the vertical direction V) may be less than a thickness of the second conductive pillar 150b. In an implementation, the thickness of the first conductive pillar 150a may be substantially the same as a vertical separation distance between the redistribution line pattern 120 and the first connection pad 160a, and the thickness of the second conductive pillar 150b may be substantially the same as a vertical separation distance between the redistribution line pattern 120 and the second connection pad 160b.

In an implementation, a width w1 (e.g., in the horizontal direction H) of the first conductive pillar 150a may be greater than a width w2 of the second conductive pillar 150b. In an implementation, the width w1 of the first conductive pillar 150a may be substantially the same as the width w2 of the second conductive pillar 150b.

In an implementation, the first connection pad 160a may be on the first conductive pillar 150a and may connect the first conductive pillar 150a to the first connection terminal 170a. In an implementation, the second connection pad 160b may be on the second conductive pillar 150b and may connect the second conductive pillar 150b to the second connection terminal 170b. The first connection pad 160a and the second connection pad 160b may function as under bump metallurgies (UBMs) for arranging the first connection terminal 170a and the second connection terminal 170b, respectively.

In an implementation, the first connection pad 160a and the second connection pad 160b may be on the second insulating layer 140. In an implementation, the first connection pad 160a and the second connection pad 160b may be in the second insulating layer 140 such that at least a portion of side surfaces of the first connection pad 160a and the second connection pad 160b is surrounded by the second insulating layer 140.

In an implementation, a material of the first connection pad 160a and the second connection pad 160b may include, e.g., a metal such as Cu, Al, W, Ti, Ta, In, Mo, Mn, Co, Sn, Ni, Mg, Re, Be, Ga, Ru, or an alloy thereof.

In an implementation, the first connection terminal 170a having a first size (e.g., volume) may be attached to the first connection pad 160a to electrically connect the chip pad 101 of the semiconductor chip 100 to an external device. In an implementation, the second connection terminal 170b having a second size (that is smaller than the first size) may be attached to the second connection pad 160b to electrically connect the chip pad 101 of the semiconductor chip 100 to an external device. The first connection terminal 170a and the second connection terminal 170b may include, e.g., a solder ball or bump.

In an implementation, a material of the first connection terminal 170a and the second connection terminal 170b may include, e.g., a metal such as Cu, Al, W, Ti, Ta, In, Mo, Mn, Co, Sn, Ni, Mg, Re, Be, Ga, or Ru or an alloy thereof. In an implementation, the first connection terminal 170a and the second connection terminal 170b may each include a metal including Sn.

The first size of the first connection terminal 170a may be greater than the second size of the second connection terminal 170b. In an implementation, a volume of the first connection terminal 170a may be greater than a volume of the second connection terminal 170b.

In an implementation, as illustrated in FIG. 2, the semiconductor package 20 may include two types of the first connection terminal 170a and the second connection terminal 170b having different sizes. In an implementation, the semiconductor package 20 may include three or more types of connection terminals having different sizes.

In an implementation, the thickness d1 of the first connection terminal 170a may be greater than the thickness d2 of the second connection terminal 170b. The thickness d1 of the first connection terminal 170a may be approximately 160 μm to approximately 300 μm, and the thickness d2 of the second connection terminal 170b may be approximately 50 µm to approximately 150 µm.

The first size of the first connection terminal 170a at or around the edge of the semiconductor package 20 may be greater than the second size of the second connection terminal 170b at or around the center of the semiconductor package 20, and the mechanical reliability (e.g., in response) to heat of the semiconductor package 20 may be improved. In an implementation, when the semiconductor package 20 is used by being mounted on a system board, a strength of thermal stress applied to the first connection terminal 170a around the edge of the semiconductor package 20 may be reduced, and thus, the occurrence of cracks on the first connection terminal 170a may be reduced.

In an implementation, the difference d1–d2 between the thickness d1 of the first connection terminal 170a and the thickness d2 of the second connection terminal 170b may be substantially the same as the difference t2–t1 between the first thickness t1 of the first part 140a of the second insulating layer 140 and the second thickness t2 of the second part 140b thereof. In an implementation, the difference d1–d2 between the thickness d1 of the first connection terminal 170a and the thickness d2 of the second connection terminal 170b and the difference t2–t1 between the first thickness t1 of the first part 140a of the second insulating layer 140 and the second thickness t2 of the second part 140b thereof may have the same value, e.g., approximately 1 µm to approximately 50 µm.

In an implementation, the lowermost ends of the first connection terminal 170a and the second connection terminal 170b may be at substantially the same level L, and the bonding reliability and the board level reliability of the semiconductor package 20 may be improved.

In an implementation, the semiconductor package 20 may be mounted on a system board 18. The system board 18 may include a first board pad 19a and a second board pad 19b thereon. The first board pad 19a may contact the first connection terminal 170a. The second board pad 19b may contact the second connection terminal 170b.

In an implementation, the system board 18 may be a single-layer printed circuit board (PCB) including the first and second board pads 19a and 19b on only one surface thereof. In an implementation, the system board 18 may be a double-layer PCB including the first and second board pads 19a and 19b on both surfaces thereof. In an implementation, the system board 18 may include, e.g., various types of substrates such as a ceramic substrate.

The various kinds of multiple individual devices of the semiconductor chip 100 may be electrically connected to the first and second board pads 19a and 19b through the redistribution via pattern 130, the redistribution line pattern 120, the first and second conductive pillars 150a and 150b, the first and second connection pads 160a and 160b, and the first and second connection terminals 170a and 170b.

In an implementation, a width (e.g., in the horizontal direction H) of the first board pad 19a may be greater than a width of the second board pad 19b. In an implementation, when viewing the first board pad 19a and the second board pad 19b from the top (e.g., along the vertical direction V), a foot-print of the first board pad 19a may be greater than a foot-print of the second board pad 19b. Accordingly, the bonding reliability of the semiconductor package 20 on the system board 18 may be improved.

In an implementation, when viewing the first board pad 19a and the second board pad 19b from the top, the width of the first board pad 19a may be substantially the same as a width of the first connection terminal 170a. In an implementation, the width of the second board pad 19b may be substantially the same as a width of the second connection terminal 170b.

Figure 3:
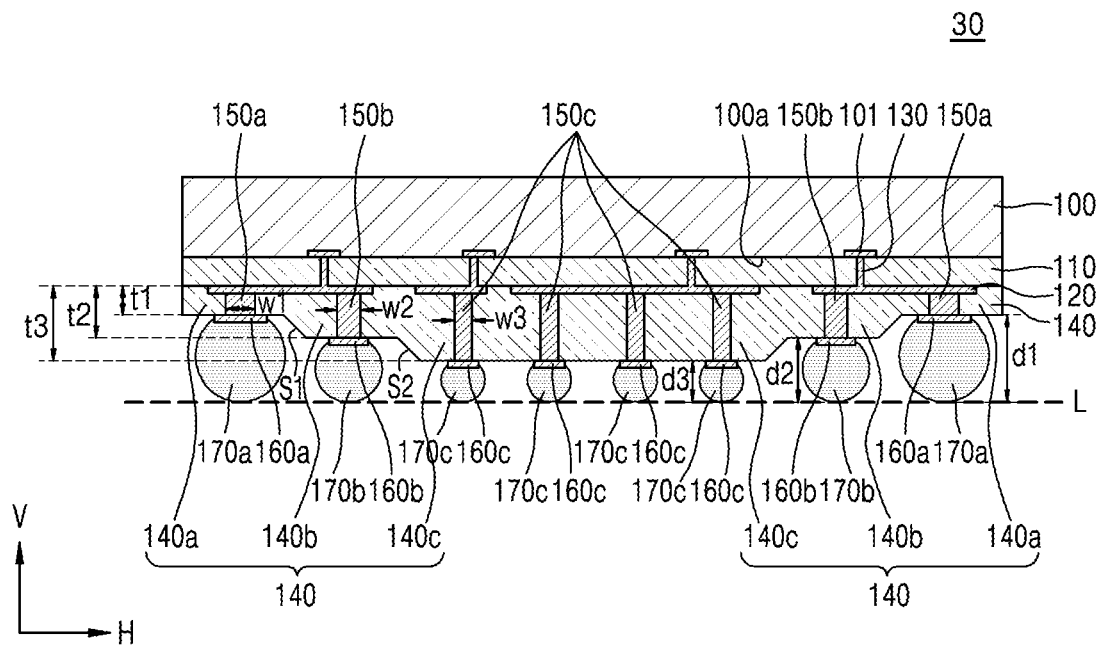

FIG. 3 is a cross-sectional view of the semiconductor package 30 according to an embodiment. Referring to FIG. 3, the semiconductor package 30 according to an embodiment may include the semiconductor chip 100 having the chip pad 101, the first insulating layer 110, the redistribution line pattern 120, the redistribution via pattern 130, the second insulating layer 140 having first, second, and third parts 140a, 140b, and 140c, first, second, and third conductive pillars 150a, 150b, and 150c, first, second, and third connection pads 160a, 160b, and 160c, and first, second, and third connection terminals 170a, 170b, and 170c.

The components of the semiconductor package 30 of FIG. 3 may be similar to the components of the semiconductor package 20 of FIG. 2. Therefore, hereinafter, differences between the semiconductor package 30 of FIG. 3 and the semiconductor package 20 described above with reference to FIG. 2 will be mainly described in detail.

In an implementation, the second insulating layer 140 may include the first part 140a having the first thickness t1, the second part 140b having the second thickness t2, and the third part 140c having a third thickness t3.

In an implementation, the first part 140a may be a part of the second insulating layer 140 having the first thickness t1 at or around an edge of the semiconductor package 30. The second part 140b may be a part of the second insulating layer 140 located further inside than (e.g., on an inner side of) the first part 140a and having the second thickness t2 greater than the first thickness t1. The third part 140c may be a part of the second insulating layer 140 located further inside than (e.g., on an inner side of) the second part 140b and having the third thickness t3 greater than the second thickness t2.

In an implementation, the first thickness t1 of the first part 140a may be approximately 3 µm to approximately 50 µm. In an implementation, the second thickness t2 of the second part 140b may have a larger value than the first thickness t1 of the first part 140a, e.g., approximately 3 µm to approximately 200 82 m. In an implementation, the third thickness t3 of the third part 140c may have a larger value than the second thickness t2 of the second part 140b, e.g., approximately 3 µm to approximately 300 µm.

In an implementation, the first thickness t1 of the first part 140a may be approximately 10 µm, the second thickness t2 of the second part 140b may be approximately 60 µm and the third thickness t3 of the third part 140c may be approximately 100 µm.

Due to the thickness difference (t2–t1) between the first part 140a and the second part 140b of the second insulating layer 140 and a thickness difference (t3–t2) between the second part 140b and the third part 140c thereof, the second insulating layer 140 may include stepped parts. In an implementation, each of the thickness difference (t2–t1) between the first part 140a and the second part 140b of the second insulating layer 140 and the thickness difference (t3–t2) between the second part 140b and the third part 140c thereof may be approximately 1 µm to approximately 50 µm.

In an implementation, the thickness difference (t2–t1) between the first part 140a and the second part 140b may be substantially the same as the thickness difference (t3–t2) between the second part 140b and the third part 140c thereof.

As shown in FIG. 3, a boundary surface S1 between the first part 140a and the second part 140b and a boundary surface S2 between the second part 140b and the third part 140c may be inclined, and the second insulating layer 140 may have a stair shape around a boundary between the first part 140*a* and the second part 140*b* and around a boundary between the second part 140*b* and the third part 140*c*. In an implementation, the boundary surfaces S1 and S2 may not be inclined.

The first conductive pillar 150*a* may pass through the first part 140*a* of the second insulating layer 140 to connect the redistribution line pattern 120 to the first connection pad 160*a*. The second conductive pillar 150*b* may pass through the second part 140*b* of the second insulating layer 140 to connect the redistribution line pattern 120 to the second connection pad 160*b*. The third conductive pillar 150*c* may pass through the third part 140*c* of the second insulating layer 140 to connect the redistribution line pattern 120 to the third connection pad 160*c*.

In an implementation, the thickness of the first conductive pillar 150*a* may be less than the thickness of the second conductive pillar 150*b*, and the thickness of the second conductive pillar 150*b* may be less than a thickness of the third conductive pillar 150*c*.

In an implementation, the width w1 of the first conductive pillar 150*a* may be greater than the width w2 of the second conductive pillar 150*b*, and the width w2 of the second conductive pillar 150*b* may be greater than a width w3 of the third conductive pillar 150*c*. In an implementation, the width w1 of the first conductive pillar 150*a*, the width w2 of the second conductive pillar 150*b*, and the width w3 of the third conductive pillar 150*c* may be substantially the same as each other.

The first size of the first connection terminal 170*a* may be greater than the second size of the second connection terminal 170*b*, and the second size of the second connection terminal 170*b* may be greater than a third size of the third connection terminal 170*c*. In an implementation, the volume of the first connection terminal 170*a* may be greater than the volume of the second connection terminal 170*b*, and the volume of the second connection terminal 170*b* may be greater than a volume of the third connection terminal 170*c*.

The thickness d1 of the first connection terminal 170*a* may be greater than the thickness d2 of the second connection terminal 170*b*, and the thickness d2 of the second connection terminal 170*b* may be greater than a thickness d3 of the third connection terminal 170*c*. The thickness d1 of the first connection terminal 170*a* may be approximately 160 μm to approximately 300 μm, the thickness d2 of the second connection terminal 170*b* may be approximately 110 μm to approximately 150 μm, and the thickness d3 of the third connection terminal 170*c* may be approximately 50 μm to approximately 100 μm.

The difference d1–d2 between the thickness d2 of the first connection terminal 170*a* and the thickness d2 of the second connection terminal 170*b* may be substantially the same as the difference t2–t1 between the first thickness t1 of the first part 140*a* of the second insulating layer 140 and the second thickness t2 of the second part 140*b* thereof. A difference d2–d3 between the thickness d2 of the second connection terminal 170*b* and the thickness d3 of the third connection terminal 170*c* may be substantially the same as a difference t3–t2 between the second thickness t2 of the second part 140*b* of the second insulating layer 140 and the third thickness t3 of the third part 140*c* thereof. In an implementation, a difference d1–d3 between the thickness d1 of the first connection terminal 170*a* and the thickness d3 of the third connection terminal 170*c* may be substantially the same as a difference t3–t1 between the first thickness t1 of the first part 140*a* of the second insulating layer 140 and the third thickness t3 of the third part 140*c* thereof.

The semiconductor package 30 may include the first to third connection terminals 170*a*, 170*b*, and 170*c* of which the sizes decrease toward a center part thereof, and the mechanical reliability in response to heat may be improved. In an implementation, the lowermost ends of the first to third connection terminals 170*a*, 170*b*, and 170*c* may be at substantially the same level L, and the bonding reliability and the board level reliability of the semiconductor package 30 may be improved.

Figure 4:
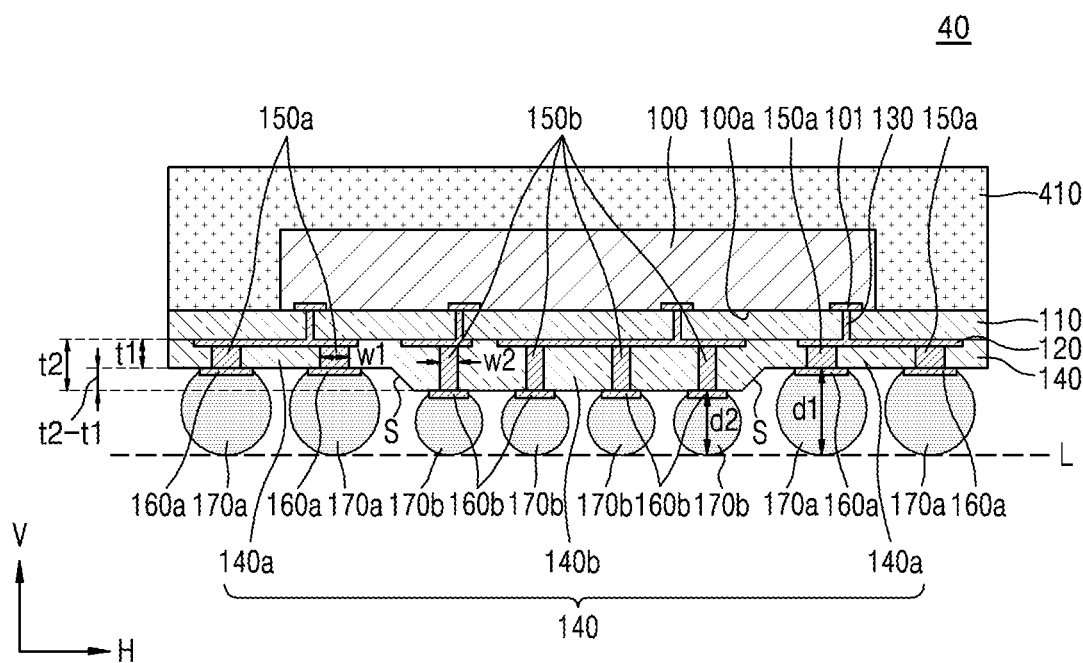

FIG. 4 is a cross-sectional view of the semiconductor package 40 according to an embodiment. The semiconductor package 40 of FIG. 4 may be a fan-out semiconductor package, and a foot-print occupied by the semiconductor chip 100 may be substantially the same as a foot-print of the semiconductor package 40.

In an implementation, at least one of the first and second connection terminals 170*a* and 170*b* may be at or adjacent to an outer side of the semiconductor chip 100. In an implementation, at least one of first connection terminals 170*a* may be at an outer side of the semiconductor chip 100.

Referring to FIG. 4, the semiconductor package 40 according to an embodiment may further include a molding layer 410. In an implementation, the molding layer 410 may cover at least a portion of the semiconductor chip 100 on the first insulating layer 110. For example, the molding layer 410 may cover all of an upper surface and side surfaces of the semiconductor chip 100, and in this case, the semiconductor chip 100 may not be exposed to the outside.

In an implementation, the molding layer 410 may include, e.g., an epoxy molding compound (EMC). In an implementation, the molding layer 410 may include various materials, e.g., an epoxy-based material, a thermosetting material, a thermoplastic material, or an ultraviolet (UV)-treated material.

The semiconductor package 40 may include the stair-shaped second insulating layer 140 having the first part 140*a* with the first thickness t1 and the second part 140*b* with the second thickness t2 greater than the first thickness t1.

In addition, the semiconductor package 40 may include the first connection terminal 170*a* having the first size and the second connection terminal 170*b* having the second size that is smaller than the first size.

In an implementation, the difference d1–d2 between the thickness d1 of the first connection terminal 170*a* and the thickness d2 of the second connection terminal 170*b* may be substantially the same as the difference t2–t1 between the first thickness t1 of the first part 140*a* of the second insulating layer 140 and the second thickness t2 of the second part 140*b* thereof. Accordingly, the lowermost ends of the first connection terminal 170*a* and the second connection terminal 170*b* may be at substantially the same level L.

Figure 5:
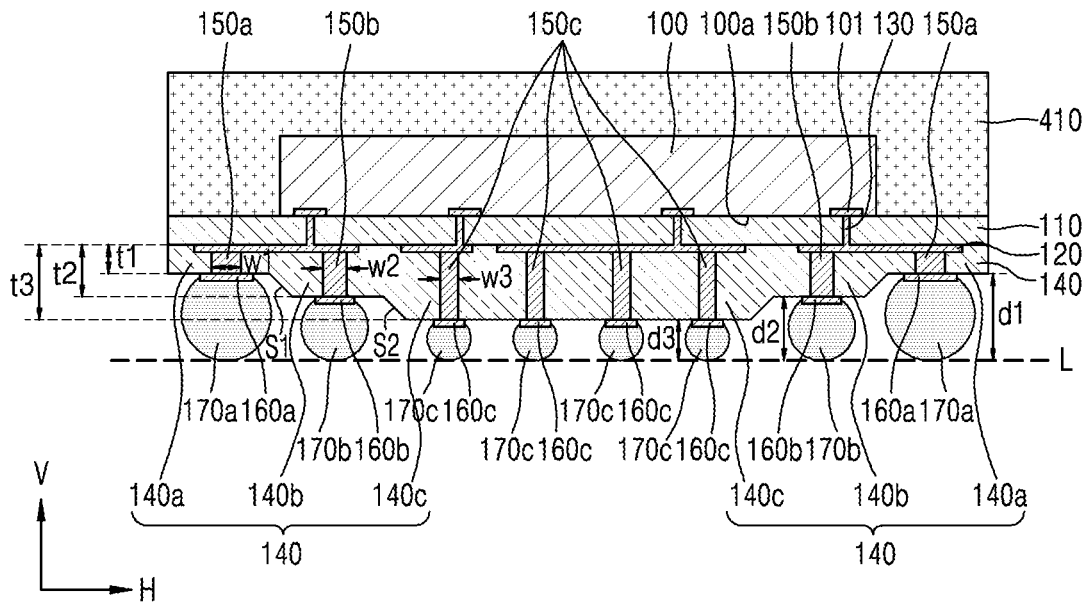

FIG. 5 is a cross-sectional view of the semiconductor package 50 according to an embodiment. The semiconductor package 50 of FIG. 5 may be a fan-out semiconductor package, and at least one of the first to third connection terminals 170*a*, 170*b*, and 170*c* may be at an outer side of the semiconductor chip 100. For example, at least one of first connection terminals 170*a* may be formed at an outer side of the semiconductor chip 100.

Referring to FIG. 5, the semiconductor package 50 may include the stair-shaped second insulating layer 140 having the first part 140*a* with the first thickness t1, the second part 140*b* with the second thickness t2 greater than the first thickness t1, and the third part 140*c* with the third thickness t3 greater than the second thickness t2.

In addition, the semiconductor package 50 may include the first connection terminal 170a having the first size, the second connection terminal 170b having the second size that is smaller than the first size, and the third connection terminal 170c having the third size that is smaller than the second size.

In an implementation, the difference d1–d2 between the thickness d1 of the first connection terminal 170a and the thickness d2 of the second connection terminal 170b may be substantially the same as the difference t2–t1 between the first thickness t1 of the first part 140a of the second insulating layer 140 and the second thickness t2 of the second part 140b thereof. The difference d2–d3 between the thickness d2 of the second connection terminal 170b and the thickness d3 of the third connection terminal 170c may be substantially the same as the difference t3–t2 between the second thickness t2 of the second part 140b of the second insulating layer 140 and the third thickness t3 of the third part 140c thereof. In addition, the difference d1–d3 between the thickness d1 of the first connection terminal 170a and the thickness d3 of the third connection terminal 170c may be substantially the same as the difference t3–t1 between the first thickness t1 of the first part 140a of the second insulating layer 140 and the third thickness t3 of the third part 140c thereof.

Accordingly, the lowermost ends of the first to third connection terminals 170a, 170b, and 170c may be at substantially the same level L.

Figure 6:
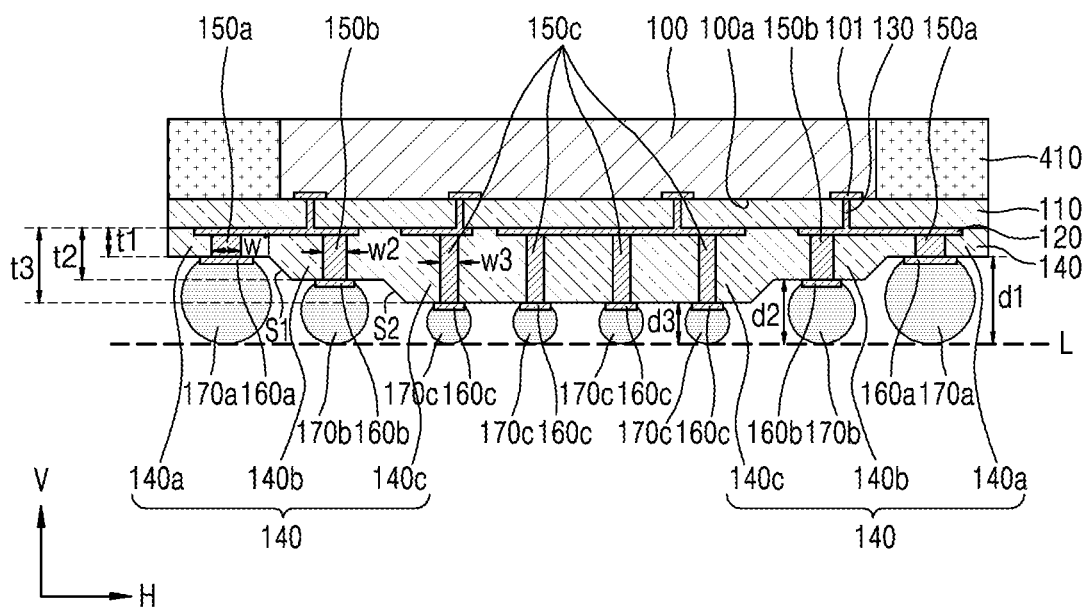

FIG. 6 is a cross-sectional view of the semiconductor package 60 according to an embodiment. The semiconductor package 60 of FIG. 6 may be a fan-out semiconductor package.

Referring to FIG. 6, the molding layer 410 may cover at least a portion of the side surfaces of the semiconductor chip 100 on the first insulating layer 110. In an implementation, the molding layer 410 may cover all (e.g., completely cover) the side surfaces of the semiconductor chip 100 on the first insulating layer 110. In this case, an upper surface of the molding layer 410 (e.g., surface facing away from the first insulating layer 110 in the vertical direction V) and the upper surface of the semiconductor chip 100 may be at substantially the same level (e.g., may be coplanar), and the upper surface of the semiconductor chip 100 may be exposed to the outside.

The upper surface of the semiconductor chip 100 may be exposed to the outside, and when the semiconductor package 60 according to an embodiment is used, heat generated by the semiconductor package 60 may be efficiently discharged to the outside. Accordingly, the heat-dissipating performance of the semiconductor package 60 may be improved.

Figure 7:
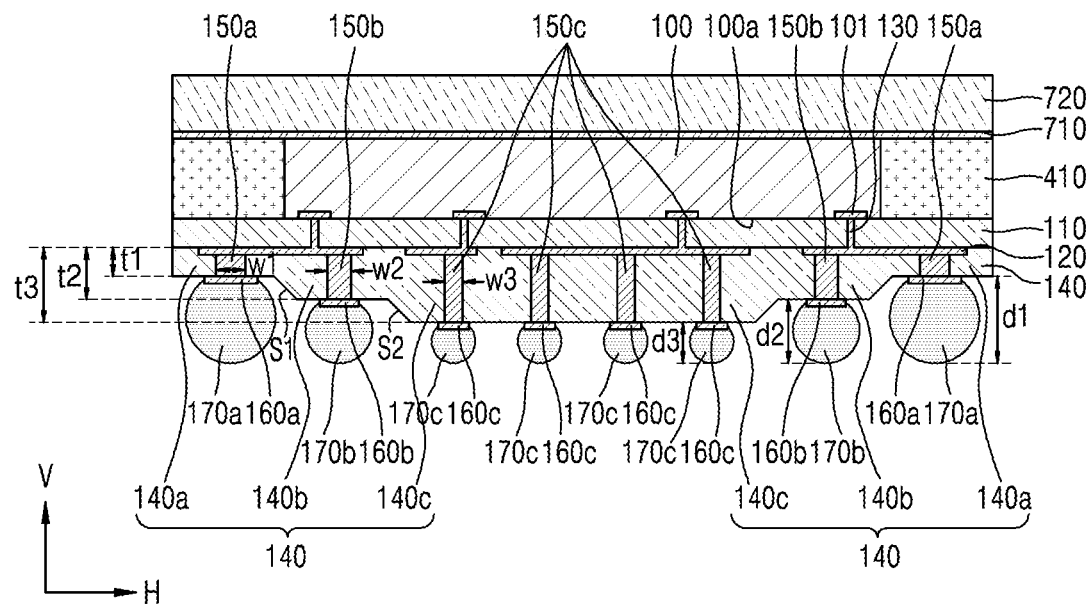

FIG. 7 is a cross-sectional view of the semiconductor package 70 according to an embodiment.

Referring to FIG. 7, the semiconductor package 70 according to an embodiment may further include a thermal interface material (TIM) 710 and a heat-dissipating member 720.

In an implementation, the heat-dissipating member 720 may include a heat slug or heat sink. In an implementation, to improve the heat-dissipating performance by increasing a surface area exposed to the outside, the heat-dissipating member 720 may include a rough heat slug or heat sink. In an implementation, the heat-dissipating member 720 may include various shaped heat slugs and heat sinks.

The heat-dissipating member 720 may include a metal material, a ceramic material, a carbon material, or a polymer material having an excellent thermal conductivity. In an implementation, the heat-dissipating member 720 may include a metal material, e.g., Cu, Al, Mg, Ni, or silver (Ag).

Referring to FIG. 7, when the upper surface of the semiconductor chip 100 is not covered by the molding layer 410, the TIM 710 may be between the semiconductor chip 100 and the heat-dissipating member 720. In an implementation, when the upper surface of the semiconductor chip 100 is covered by the molding layer 410, the TIM 710 may be between the molding layer 410 and the heat-dissipating member 720.

In an implementation, the TIM 710 may include, e.g., mineral oil, grease, gap filler putty, phase change gel, phase change material pads, or particle filled epoxy.

The semiconductor package 70 according to an embodiment may include the TIM 710 and heat-dissipating member 720, and the heat-dissipating performance of the semiconductor package 70 may be improved.

Figure 8:
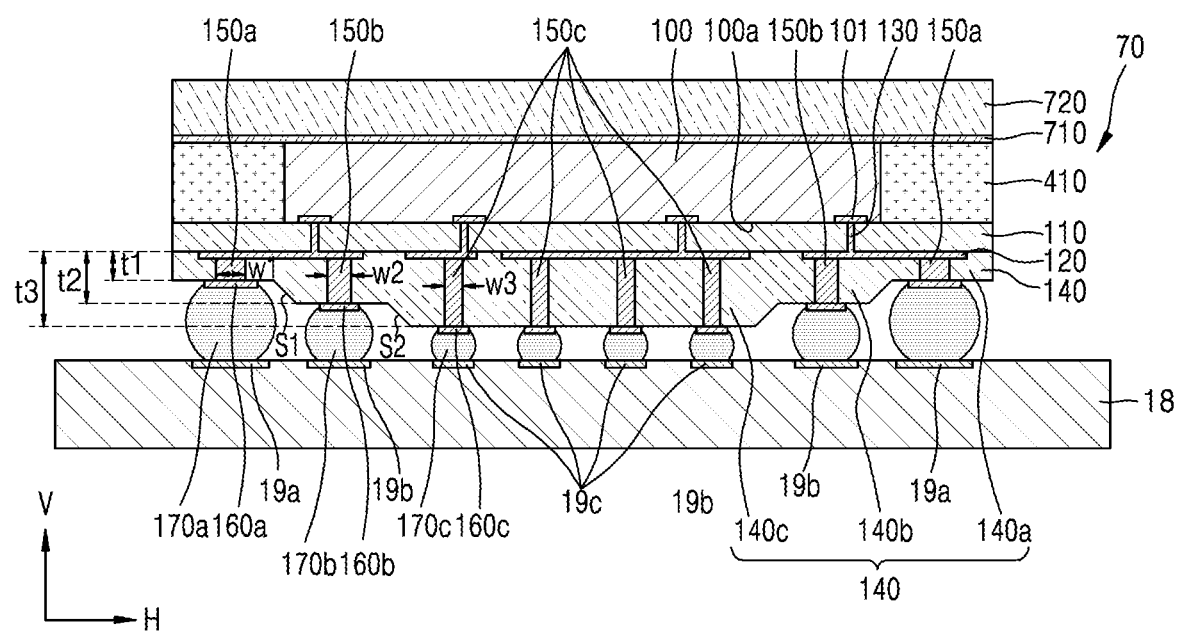
FIG. 8 is a cross-sectional view of an electronic device according to an embodiment.

FIG. 8 is a cross-sectional view of an electronic device 1 according to an embodiment.

Referring to FIG. 8, the electronic device 1 according to an embodiment may include the system board 18 and the semiconductor package 70 mounted on the system board 18.

In an implementation, the system board 18 may have first, second, and third board pads 19a, 19b, and 19c thereon. The first, second, and third board pads 19a, 19b, and 19c may contact the first, second, and third connection terminals 170a, 170b, and 170c of the semiconductor package 70, respectively. The various kinds of multiple individual devices of the semiconductor chip 100 may be electrically connected to the first, second, and third board pads 19a, 19b, and 19c through the redistribution via pattern 130, the redistribution line pattern 120, the first, second, and third conductive pillars 150a, 150b, and 150c, the first, second, and third connection pads 160a, 160b, and 160c, and the first, second, and third connection terminals 170a, 170b, and 170c.

In an implementation, the system board 18 may be a single-layer PCB including the first, second, and third board pads 19a, 19b, and 19c on only one surface thereof. In an implementation, the system board 18 may be a double-layer PCB including the first, second, and third board pads 19a, 19b, and 19c on both surfaces thereof. In an implementation, the system board 18 may include, e.g., various types of substrates such as a ceramic substrate.

In an implementation, the electronic device 1 according to an embodiment may further include an under-fill layer surrounding the first to third connection terminals 170a, 170b, and 170c on the system board 18. In an implementation, the under-fill layer may be omitted.

In an implementation, the width of the first board pad 19a may be greater than the width of the second board pad 19b, and the width of the second board pad 19b may be greater than a width of the third board pad 19c (in the horizontal direction H). In an implementation, when viewing the first to third board pads 19a, 19b, and 19c from the top, the foot-print (e.g., area) of the first board pad 19a may be greater than the foot-print of the second board pad 19b, and the foot-print of the second board pad 19b may be greater than a foot-print of the third board pad 19c. Accordingly, the bonding reliability of the semiconductor package 70 on the system board 18 may be improved.

In an implementation, when viewing the first to third board pads 19a, 19b, and 19c from the top, the width of the first board pad 19a may be substantially the same as the width of the first connection terminal 170a, the width of the second board pad 19b may be substantially the same as the width of the second connection terminal 170b, and the width of the third board pad 19c may be substantially the same as a width of the third connection terminal 170c.

The semiconductor package 70 mounted on the system board 18 may include the first to third connection terminals 170a, 170b, and 170c of which the sizes increase from the center thereof toward an edge thereof, when the semiconductor package 70 is used by being mounted on the system board 18, a strength of thermal stress applied to the first to third connection terminals 170a, 170b, and 170c may be reduced, and the occurrence of cracks on the first to third connection terminals 170a, 170b, and 170c may be reduced.

In addition, the lowermost ends of the first to third connection terminals 170a, 170b, and 170c may be at substantially the same level L, and the bonding reliability and the board level reliability of the semiconductor package 70 may be improved.

FIGS. 9 to 19 are cross-sectional views of stages in a method of manufacturing a semiconductor package, according to an embodiment. FIGS. 9 to 19 show operations of a method of manufacturing the semiconductor package 60 described above with reference to FIG. 6.

Figure 9:
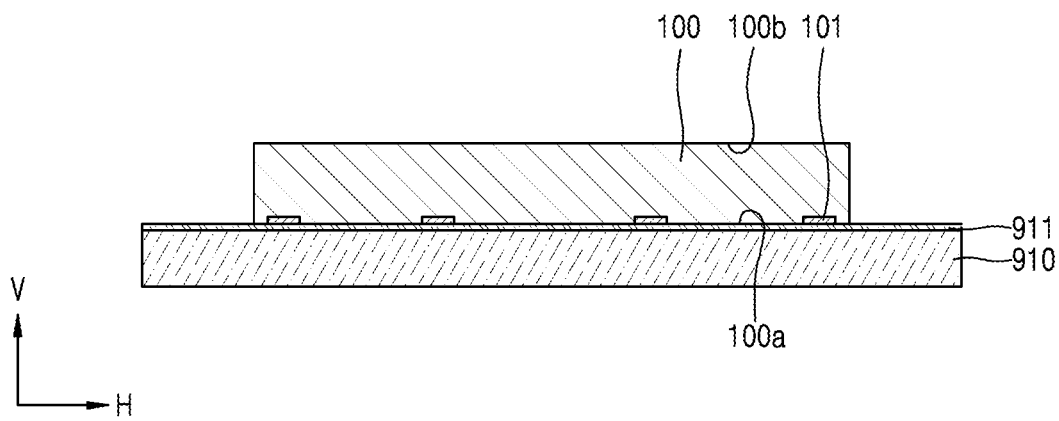
FIGS. 9 to 19 are cross-sectional views of stages in a method of manufacturing a semiconductor package, according to an embodiment.

FIG. 9 is a cross-sectional view of an operation of mounting the semiconductor chip 100 on a first support substrate 910.

Referring to FIG. 9, the method of manufacturing the semiconductor package 60 may include an operation of attaching the semiconductor chip 100 onto the first support substrate 910.

A first release film 911 may be attached to the first support substrate 910, and the first surface 100a of the semiconductor chip 100 may be attached to the first release film 911.

The first support substrate 910 may have stability for a photolithography process, an etching process, a baking process, and the like. When the first support substrate 910 is to be separated and removed by laser ablation (e.g., in a later stage), the first support substrate 910 may include a light-transmissive substrate. In an implementation, when the first support substrate 910 is to be separated and removed by heating, the first support substrate 910 may include a heat-resistant substrate.

In an implementation, the first support substrate 910 may include a glass substrate. In an implementation, the first support substrate 910 may include a heat-resistant organic polymer material such as polyimide (PI), polyetheretherketone (PEEK), polyethersulfone (PES), or polyphenylene sulfide (PPS).

The first release film 911 may be, e.g., a laser-reactive layer separable from the first support substrate 910 in reaction to future laser emission thereon. In an implementation, the first release film 911 may include a carbon material layer, e.g., an amorphous carbon layer (ACL).

Figure 10:
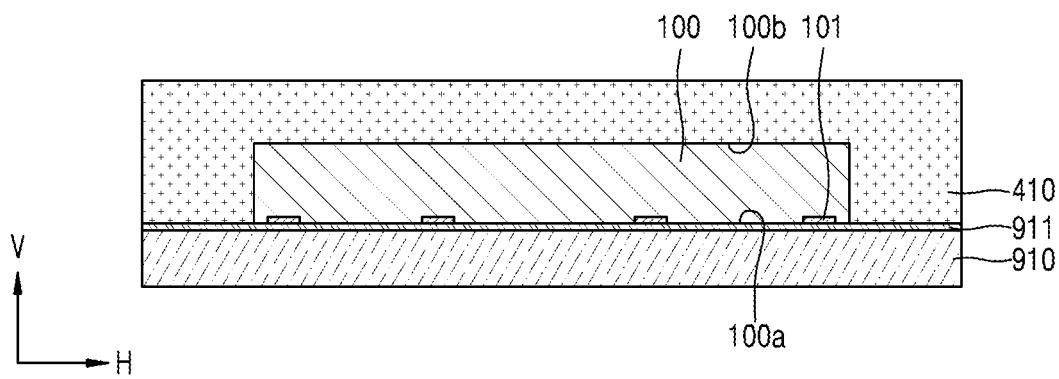

FIG. 10 is a cross-sectional view of an operation of forming the molding layer 410.

Referring to FIG. 10, the method of manufacturing the semiconductor package 60 may include an operation of forming the molding layer 410 encompassing at least a portion of the side surface of the semiconductor chip 100 on the first support substrate 910. The molding layer 410 may be substantially the same as described with reference to FIG. 4.

Figure 11:
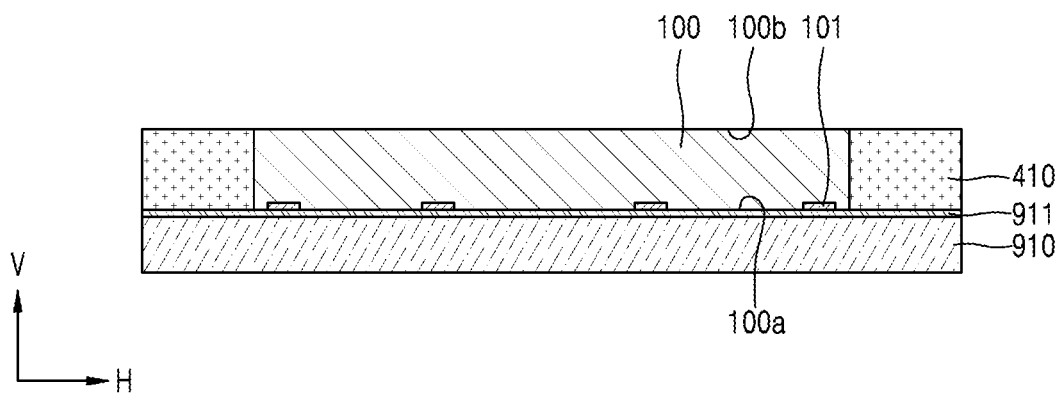

FIG. 11 is a cross-sectional view of an operation of removing a portion of the molding layer 410.

Referring to FIG. 11, the method of manufacturing the semiconductor package 60 may include an operation of removing a portion of an upper part of the molding layer 410.

In an implementation, the upper part of the molding layer 410 may be removed such that the upper part of the molding layer 410 is at substantially the same level as an upper surface 100b of the semiconductor chip 100 (e.g., coplanar). In an implementation, the upper part of the molding layer 410 may be removed by a grinding process, or the upper part of the molding layer 410 may be removed by various other suitable methods. When the upper part of the molding layer 410 is at substantially the same level as the upper surface 100b of the semiconductor chip 100, the upper surface 100b (or the second surface 100b) of the semiconductor chip 100 may be exposed to the outside.

After the operation of removing a portion of the upper part of the molding layer 410, an operation of separating the first support substrate 910 and the first release film 911 from the semiconductor chip 100 may be performed.

Figure 12:
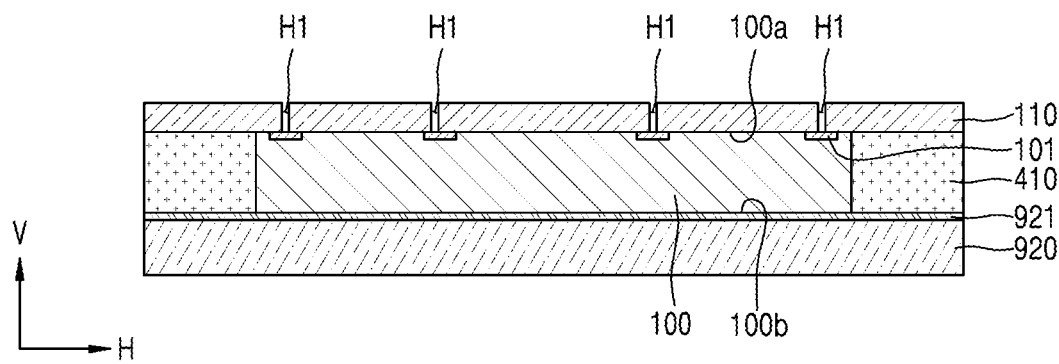

FIG. 12 is a cross-sectional view of an operation of forming the first insulating layer 110 on the semiconductor chip 100 and an operation of forming a redistribution via opening H1 in the first insulating layer 110.

Referring to FIG. 12, the method of manufacturing the semiconductor package 60 may include an operation of forming the first insulating layer 110 on the first surface 100a of the semiconductor chip 100 and an operation of forming the redistribution via opening H1 in the first insulating layer 110.

Before the operation of forming the first insulating layer 110, an operation of attaching the second surface 100b (opposite to the first surface 100a) of the semiconductor chip 100 to a second support substrate 920 to which a second release film 921 is attached may be performed. The second support substrate 920 and the second release film 921 may be substantially the same as the first support substrate 910 and the first release film 911.

The operation of forming the first insulating layer 110 may include forming the first insulating layer 110 to a thickness of approximately 2 μm to approximately 100 μm on the first surface 100a of the semiconductor chip 100.

In addition, the operation of forming the first insulating layer 110 may include forming the first insulating layer 110 on the first surface 100a of the semiconductor chip 100 by using an insulating material such as a PID material on which a photolithography process is possible (e.g., PSPI, PBO, or the like).

The forming the redistribution via opening H1 may include forming the redistribution via opening H1 in a portion of the first insulating layer 110 overlapping the chip pad 101 in the vertical direction, to expose (e.g., a part of) the chip pad 101 therethrough.

The redistribution via opening H1 may be formed in the first insulating layer 110 by various methods including an etching process, a reactive ion etching (RIE) process using plasma, a laser drilling process, or the like.

Figure 13:
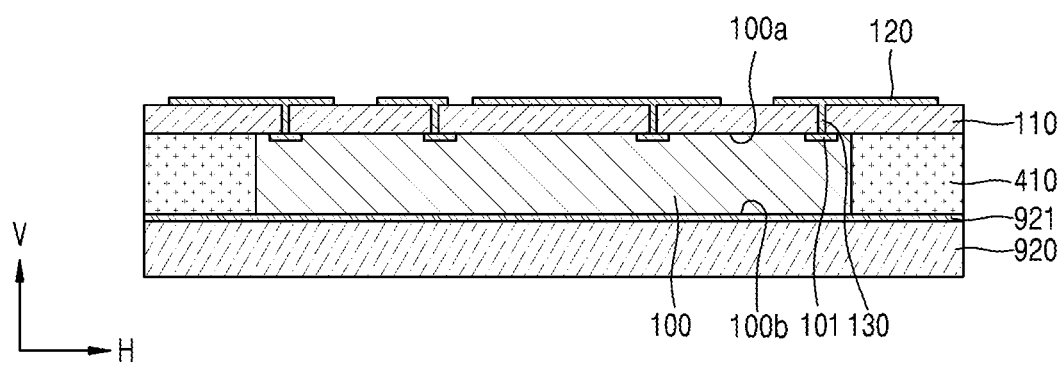

FIG. 13 is a cross-sectional view of an operation of forming the redistribution line pattern 120 and the redistribution via pattern 130.

Referring to FIG. 13, the method of manufacturing the semiconductor package 60 may include an operation of forming the redistribution via pattern 130 passing through the first insulating layer 110 and connected to the chip pad 101 and an operation of forming the redistribution line pattern 120 connected to the redistribution via pattern 130 on the first insulating layer 110.

In an implementation, the method of manufacturing the semiconductor package 60 may further include conformally forming a seed layer on an upper surface of the first insulating layer 110.

In an implementation, the seed layer may be formed through a physical vapor deposition process, and the redistribution line pattern 120 and the redistribution via pattern 130 may be formed through a plating process. In an implementation, the seed layer, the redistribution line pattern 120, and the redistribution via pattern 130 may be formed by various methods.

In an implementation, the redistribution via pattern 130 and the redistribution line pattern 120 may include a metal such as Cu, Al, W, Ti, Ta, In, Mo, Mn, Co, Sn, Ni, Mg, Re, Be, Ga, or Ru or an alloy thereof. In an implementation, the redistribution via pattern 130 and the redistribution line pattern 120 may include various conductive materials.

Figure 14:
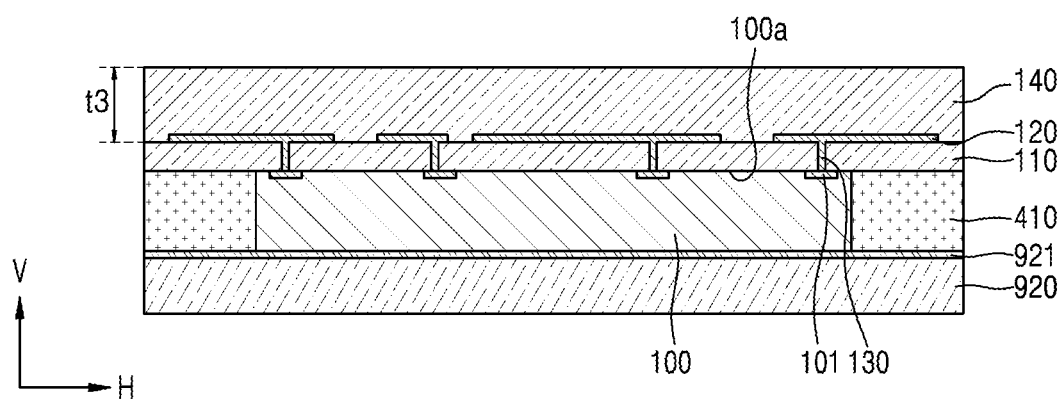

FIG. 14 is a cross-sectional view of an operation of forming the second insulating layer 140.

Referring to FIG. 14, the method of manufacturing the semiconductor package 60 may include an operation of forming the second insulating layer 140 on the first insulating layer 110 so as to cover the redistribution line pattern 120.

The operation of forming the second insulating layer 140 may include forming the second insulating layer 140 to a thickness of approximately 3 μm to approximately 300 μm on the first insulating layer 110. In an implementation, the thickness t3 of second insulating layer 140 formed on the first insulating layer 110 may be substantially the same as the thickness t3 of the third part 140c of the second insulating layer 140 of the semiconductor package 60 of FIG. 6, which is described above.

In addition, the operation of forming the second insulating layer 140 may include forming, on the first insulating layer 110, an insulating material such as a PID material on which a photolithography process is possible. In an implementation, the second insulating layer 140 may include PSPI or PBO.

Figure 15:
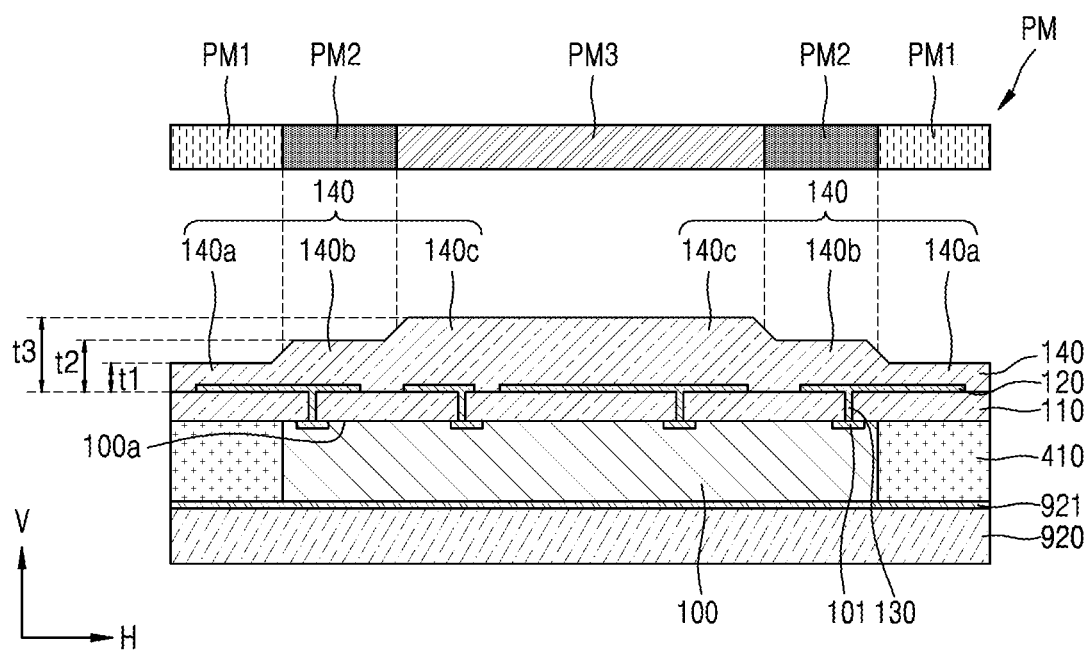

FIG. 15 is a cross-sectional view of an operation of forming a stepped part by removing a portion of the second insulating layer 140.

Referring to FIG. 15, the method of manufacturing the semiconductor package 60 may include an operation of removing a portion of the second insulating layer 140 such that the second insulating layer 140 has a stepped part. In an implementation, the operation of forming a stepped part on the second insulating layer 140 may include removing a portion of the second insulating layer 140 such that the second insulating layer 140 has a stair shape.

The second insulating layer 140 may be removed mechanically or chemically. In an implementation, a portion of the second insulating layer 140 may be removed by an etching process or a photolithography process. Hereinafter, a method of forming a stepped part on the second insulating layer 140 through a photolithography process will be described.

In an implementation, a photo mask PM may be prepared to expose the second insulating layer 140 to light. The photo mask PM may include a first mask PM1, a second mask PM2, and a third mask PM3.

The first mask PM1 may be a portion at an edge of the photo mask PM. In addition, the first mask PM1 may be used to form the first part 140a of the second insulating layer 140. The first mask PM1 may transmit therethrough most of the light emitted from exposure equipment.

The second mask PM2 may be a portion of the photo mask PM between the first mask PM1 and the third mask PM3 to be described below. In addition, the second mask PM2 may be used to form the second part 140b of the second insulating layer 140. The second mask PM2 may transmit therethrough only a portion of the light emitted from the exposure equipment and block the remaining light.

The third mask PM3 may be at a center part of the photo mask PM. In addition, the third mask PM3 may be used to form the third part 140c of the second insulating layer 140. The third mask PM3 may block the entire light emitted from the exposure equipment.

In an implementation, a portion of the second insulating layer 140 corresponding to the first mask PM1 may be removed to form the first part 140a of the first thickness t1. In addition, a portion of the second insulating layer 140 corresponding to the second mask PM2 may be removed to form the second part 140b of the second thickness t2 greater than the first thickness t1. In an implementation, a portion of the second insulating layer 140 corresponding to the third mask PM3 may be removed to form the third part 140c of the third thickness t3 greater than the second thickness t2.

According to the thickness differences, a stepped part may be formed between the first part 140a and the second part 140b and between the second part 140b and the third part 140c, and the stair-shaped second insulating layer 140 may be formed. In an implementation, the method of forming the stair-shaped second insulating layer 140 may include other suitable methods.

Figure 16:
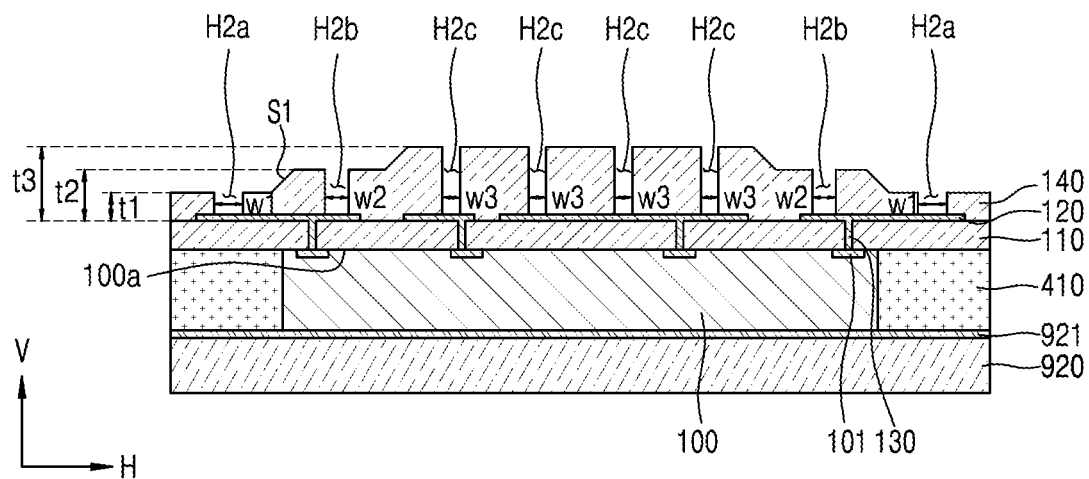

FIG. 16 is a cross-sectional view of an operation of forming first to third pillar openings H2a, H2b, and H2c in the second insulating layer 140.

Referring to FIG. 16, the method of forming the semiconductor package 60 may include an operation forming the first to third pillar openings H2a, H2b, and H2c in a portion of the second insulating layer 140 overlapping the redistribution line pattern 120 in the vertical direction V, to expose the redistribution line pattern 120 therethrough.

The first pillar opening H2a may be formed in the first part 140a of the second insulating layer 140 to expose a portion of the redistribution line pattern 120 therethrough. The second pillar opening H2b may be formed in the second part 140b of the second insulating layer 140 to expose a portion of the redistribution line pattern 120 therethrough. In addition, the third pillar opening H2c may be formed in the third part 140c of the second insulating layer 140 to expose a portion of the redistribution line pattern 120 therethrough.

The first to third pillar openings H2a, H2b, and H2c may be formed in the second insulating layer 140 by various methods including an etching process, an RIE process using plasma, a laser drilling process, or the like.

In an implementation, a width w1 of the first pillar opening H2a may be less than widths w2 and w3 of the second and third pillar openings H2b and H2c (in the horizontal direction H). The width w2 of the second pillar opening H2b may be greater than the width w1 of the first pillar opening H2a and less than the width w3 of the third pillar opening H2c. In an implementation, the width w3 of the third pillar opening H2c may be less than the widths w1 and w2 of the first and second pillar openings H2a and H2b.

Accordingly, in an operation of forming the first to third conductive pillars 150a, 150b, and 150c, a difference in respective process times the first to third conductive pillars 150a, 150b, and 150c are filled with a conductive material may be reduced.

In an implementation, the widths w1, w2, and w3 of the first to third conductive pillars 150a, 150b, and 150c may be substantially the same as each other.

Figure 17:
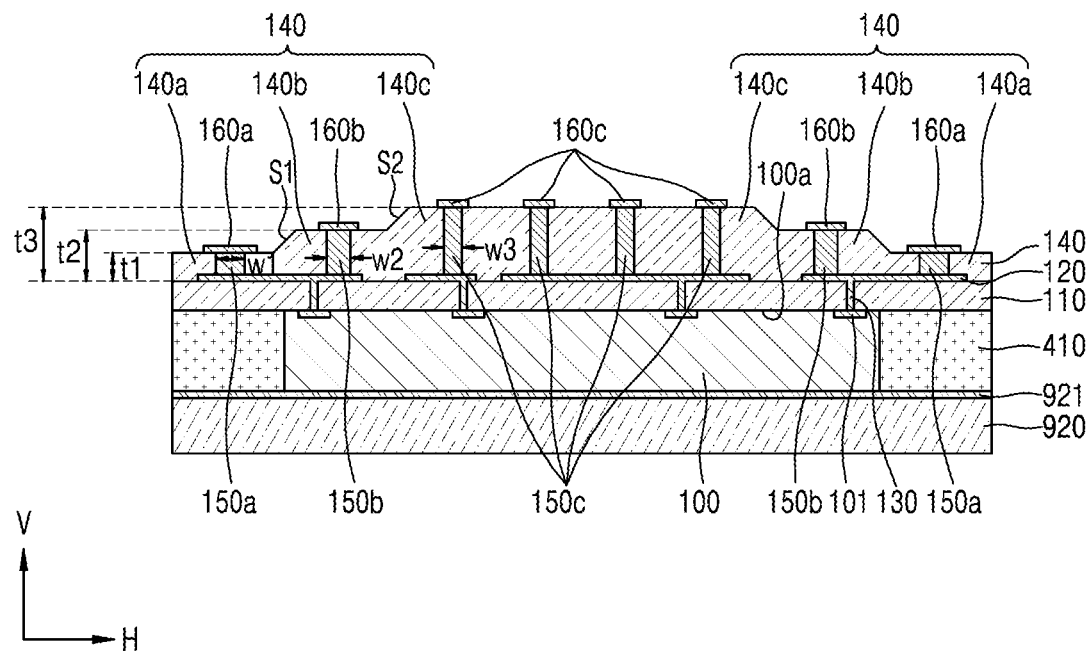

FIG. 17 is a cross-sectional view of an operation of forming the first to third conductive pillars 150a, 150b, and 150c and the first to third connection pads 160a, 160b, and 160c.

Referring to FIG. 17, the method of forming the semiconductor package 60 may include an operation of forming the first to third conductive pillars 150a, 150b, and 150c and the first to third connection pads 160a, 160b, and 160c.

In an implementation, the semiconductor package 60 may further include an operation of forming a seed layer on the second insulating layer 140.

The seed layer may be formed through a physical vapor deposition process, and the first to third conductive pillars 150a, 150b, and 150c may be formed through a plating process. In an implementation, the seed layer and the first to third conductive pillars 150a, 150b, and 150c may be formed by other suitable methods.

In an implementation, the first to third conductive pillars 150a, 150b, and 150c may include a metal such as Cu, Al, W, Ti, Ta, In, Mo, Mn, Co, Sn, Ni, Mg, Re, Be, Ga, or Ru or an alloy thereof. In an implementation, the first to third conductive pillars 150a, 150b, and 150c may include various conductive materials.

In an implementation, at least a portion of the first to third connection pads 160a, 160b, and 160c may be exposed to the outside. In an implementation, upper surfaces of the first to third connection pads 160a, 160b, and 160c may be exposed to the outside. The exposed upper surfaces of the first to third connection pads 160a, 160b, and 160c may come in contact with the first to third connection terminals 170a, 170b, and 170c to be described below, respectively.

Side surfaces of the first to third connection pads 160a, 160b, and 160c may not be surrounded by the second insulating layer 140. In an implementation, at least a portion of the side surfaces of the first to third connection pads 160a, 160b, and 160c may be surrounded by the second insulating layer 140.

In an implementation, the first to third connection pads 160a, 160b, and 160c may include a metal such as Cu, Al, W, Ti, Ta, In, Mo, Mn, Co, Sn, Ni, Mg, Re, Be, Ga, or Ru or an alloy thereof. In an implementation, the first to third connection pads 160a, 160b, and 160c may include various conductive materials.

In an implementation, the method of forming the semiconductor package 60 may further include an operation of forming a protective layer on the second insulating layer 140 to encompass or cover the side surfaces of the first to third connection pads 160a, 160b, and 160c and expose the upper surface of the first to third connection pads 160a, 160b, and 160c therethrough.

Figure 18:
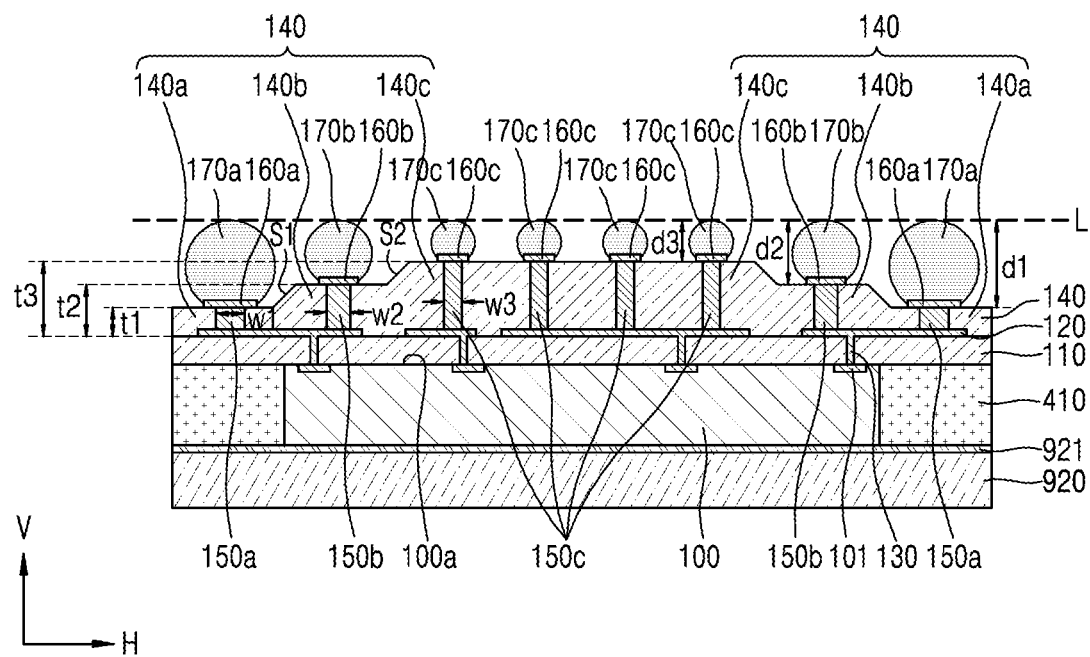

FIG. 18 is a cross-sectional view of an operation of forming the first to third connection terminals 170a, 170b, and 170c. Referring to FIG. 18, the method of forming the semiconductor package 60 may include an operation of forming the first to third connection terminals 170a, 170b, and 170c.

In an implementation, the first to third connection terminals 170a, 170b, and 170c may be formed in contact with the first to third connection pads 160a, 160b, and 160c, respectively. In an implementation, the first to third connection terminals 170a, 170b, and 170c may be formed in contact with at least a portion of upper surfaces and side surfaces of the first to third connection pads 160a, 160b, and 160c, respectively. In an implementation, the first to third connection terminals 170a, 170b, and 170c may be formed in contact with the upper surfaces of the first to third connection pads 160a, 160b, and 160c and the side surfaces thereof.

In an implementation, a material of the first to third connection terminals 170a, 170b, and 170c may include a metal such as Cu, Al, W, Ti, Ta, In, Mo, Mn, Co, Sn, Ni, Mg, Re, Be, Ga, or Ru or an alloy thereof. In an implementation, the first to third connection terminals 170a, 170b, and 170c may include a metal including Sn.

The first size of the first connection terminal 170a may be greater than the second size of the second connection terminal 170b. In an implementation, the second size of the second connection terminal 170b may be greater than the third size of the third connection terminal 170c. In an implementation, the volume of the first connection terminal 170a may be greater than the volume of the second connection terminal 170b, and the volume of the second connection terminal 170b may be greater than the volume of the third connection terminal 170c.

In an implementation, the thickness d1 of the first connection terminal 170a may be greater than the thickness d2 of the second connection terminal 170b, and the thickness d2 of the second connection terminal 170b may be greater than the thickness d3 of the third connection terminal 170c.

In an implementation, the thickness d1 of the first connection terminal 170a may be approximately 160 μm to approximately 300 μm, the thickness d2 of the second connection terminal 170b may be approximately 110 μm to approximately 150 μm, and the thickness d3 of the third connection terminal 170c may be approximately 50 μm to approximately 100 μm.

The difference d1−d2 between the thickness d1 of the first connection terminal 170a and the thickness d2 of the second connection terminal 170b may be substantially the same as the difference t2−t1 between the first thickness t1 of the first part 140a of the second insulating layer 140 and the second thickness t2 of the second part 140b thereof. The difference d2−d3 between the thickness d2 of the second connection terminal 170b and the thickness d3 of the third connection terminal 170c may be substantially the same as the difference t3−t2 between the second thickness t2 of the second part 140b of the second insulating layer 140 and the third thickness t3 of the third part 140c thereof. In addition, the difference d1−d3 between the thickness d1 of the first connection terminal 170a and the thickness d3 of the third connection terminal 170c may be substantially the same as the difference t3−t1 between the first thickness t1 of the first part 140a of the second insulating layer 140 and the third thickness t3 of the third part 140c thereof The semiconductor package 60 according to an embodiment may include the first to third connection terminals 170a, 170b, and 170c (of which the sizes gradually decrease toward a center part thereof), and the semiconductor package 60 formed by the manufacturing method may have an improved mechanical reliability or resistance to heat.

In addition, the lowermost ends of the first to third connection terminals 170a, 170b, and 170c may be at substantially the same level L, and the bonding reliability and the board level reliability of the semiconductor package 60 formed by the manufacturing method according to the present embodiment may be improved.

Figure 19:
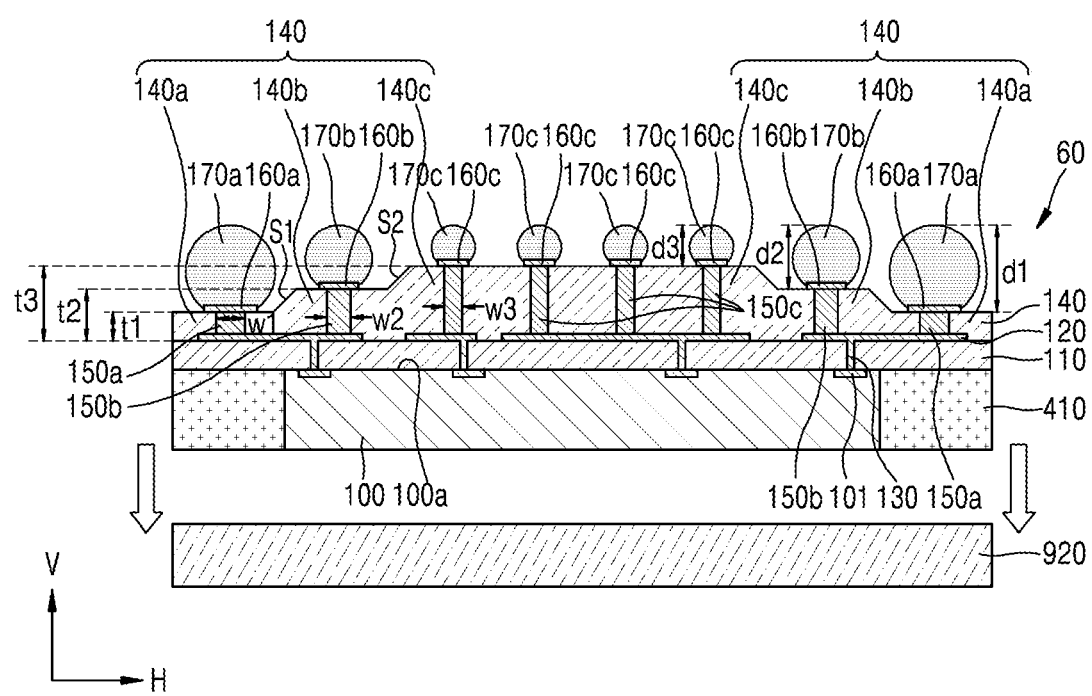

FIG. 19 is a cross-sectional view of an operation of separating the second release film 921 and the second support substrate 920. Referring to FIG. 19, the method of manufacturing the semiconductor package 60 may include an operation of separating the second release film 921 and the second support substrate 920. By separating the second release film 921 and the second support substrate 920, the semiconductor package 60 according to an embodiment may be manufactured.

The second release film 921 and the second support substrate 920 may be substantially the same as the first release film 911 and the first support substrate 910 described with reference to FIG. 9.

In an implementation, the second release film 921 may be a laser-reacting layer vaporized in reaction to laser emission, and when the second release film 921 is vaporized, the second support substrate 920 may be separated from the semiconductor package 60. In an implementation, the second support substrate 920 may be separated from the semiconductor package 60 by various suitable methods. In an implementation, when the second release film 921 is dissolved in water, the second support substrate 920 may be separated from the semiconductor package 60.

By way of summation and review, when a semiconductor package is used, cracks may occur on a connection terminal of the semiconductor package due to a difference in a coefficient of thermal expansion between the semiconductor package and the system board. For example, a connection terminal at an edge portion of the semiconductor package may be more vulnerable to heat than a connection terminal at a central portion thereof, and accordingly, cracks may more frequently form on the connection terminal at the edge portion of the semiconductor package.

One or more embodiments may provide a semiconductor package having an improved mechanical reliability in response to heat.

One or more embodiments may provide a semiconductor package of which a bonding reliability on a system board and a board level reliability are improved.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor package, comprising:
   a semiconductor chip having a first surface that includes a chip pad thereon;
   a first insulating layer covering the first surface;
   a redistribution line pattern on the first insulating layer;
   a redistribution via pattern passing through the first insulating layer to connect the chip pad to the redistribution line pattern;
   a second insulating layer covering the redistribution line pattern on the first insulating layer, the second insulating layer including a first part having a first thickness and a second part having a second thickness greater than the first thickness, the second part being disposed inwardly in the semiconductor package relative to the first part;
   a first conductive pillar passing through the first part of the second insulating layer and connected to the redistribution line pattern;
   a second conductive pillar passing through the second part of the second insulating layer and connected to the redistribution line pattern;
   a first connection pad on the first conductive pillar;
   a second connection pad on the second conductive pillar;
   at least one first connection terminal in contact with the first connection pad and having a first size; and
   a second connection terminal in contact with the second connection pad and having a second size that is smaller than the first size.

2. The semiconductor package as claimed in claim 1, wherein a thickness difference between the at least one first connection terminal and the second connection terminal is the same as a thickness difference between the first part and the second part of the second insulating layer.

3. The semiconductor package as claimed in claim 1, wherein a lowermost end of the at least one first connection terminal and a lowermost end of the second connection terminal are at a same level.

4. The semiconductor package as claimed in claim 1, wherein:
   a thickness of the at least one first connection terminal is 160 μm to 300 μm, and
   a thickness of the second connection terminal is 50 μm to 150 μm.

5. The semiconductor package as claimed in claim 1, wherein a thickness difference between the at least one first connection terminal and the second connection terminal is 1 μm to 50 μm.

6. The semiconductor package as claimed in claim 1, wherein the second insulating layer includes a photosensitive polyimide or polybenzobisoxazole.

7. The semiconductor package as claimed in claim 1, further comprising a molding material surrounding a side surface of the semiconductor chip,
   wherein:
   the at least one first connection terminal includes a plurality of first connection terminals, and
   one of the first connection terminals is at an outer side of the semiconductor chip.

8. The semiconductor package as claimed in claim 7, wherein the molding material exposes an upper surface of the semiconductor chip.

9. The semiconductor package as claimed in claim 1, wherein a width of the first conductive pillar is greater than a width of the second conductive pillar.

10. A semiconductor package, comprising:
    a semiconductor chip having a first surface that includes a chip pad thereon;
    a first insulating layer covering the first surface;
    a redistribution line pattern on the first insulating layer;
    a redistribution via pattern passing through the first insulating layer to connect the chip pad to the redistribution line pattern;
    a second insulating layer covering the redistribution line pattern on the first insulating layer and including a first part having a first thickness, a second part having a second thickness greater than the first thickness, and a third part having a third thickness greater than the second thickness, the second part being disposed inwardly in the semiconductor package relative to the first part, and the third part being disposed inwardly in the semiconductor package relative to the second part;
    a first conductive pillar passing through the first part of the second insulating layer and connected to the redistribution line pattern;
    a second conductive pillar passing through the second part of the second insulating layer and connected to the redistribution line pattern; and
    a third conductive pillar passing through the third part of the second insulating layer and connected to the redistribution line pattern.

11. The semiconductor package as claimed in claim 10, further comprising:

at least one first connection terminal connected to the first conductive pillar and having a first size;

a second connection terminal connected to the second conductive pillar and having a second size that is smaller than the first size; and a third connection terminal connected to the third conductive pillar and having a third size that is smaller than the second size.

12. The semiconductor package as claimed in claim 11, wherein:

a volume of the at least one first connection terminal is greater than a volume of the second connection terminal, and the volume of the second connection terminal is greater than a volume of the third connection terminal.

13. The semiconductor package as claimed in claim 11, wherein a lowermost end of the at least one first connection terminal, a lowermost end of the second connection terminal, and a lowermost end of the third connection terminal are at a same level.

14. The semiconductor package as claimed in claim 11, wherein:

a thickness of the at least one first connection terminal is 160 μm to 300 μm, a thickness of the second connection terminal is 110 μm to 150 μm, and a thickness of the third connection terminal is 50 μm to 100 μm.

15. The semiconductor package as claimed in claim 11, wherein the at least one first connection terminal, the second connection terminal, and the third connection terminal each independently include tin (Sn), copper (Cu), aluminum (Al), tungsten (W), titanium (Ti), tantalum (Ta), indium (In), molybdenum (Mo), manganese (Mn), cobalt (Co), nickel (Ni), magnesium (Mg), rhenium (Re), beryllium (Be), gallium (Ga), or ruthenium (Ru).

16. The semiconductor package as claimed in claim 11, wherein a boundary surface between the first part and the second part of the second insulating layer is inclined.

17. The semiconductor package as claimed in claim 11, further comprising:

a molding layer surrounding a side surface of the semiconductor chip, an upper surface of the semiconductor chip being exposed through the molding layer;

a thermal interface material on the semiconductor chip; and a heat-dissipating member on the thermal interface material, wherein:

the at least one first connection terminal includes a plurality of first connection terminals, and one of the first connection terminals is at an outer side of the semiconductor chip.

18. The semiconductor package as claimed in claim 11, wherein:

a width of the first conductive pillar is greater than a width of the second conductive pillar, and the width of the second conductive pillar is greater than a width of the third conductive pillar.

19. A semiconductor package, comprising:

a semiconductor chip having a first surface that includes a chip pad thereon;

a first insulating layer covering the first surface;

a redistribution line pattern on the first insulating layer;

a redistribution via pattern passing through the first insulating layer to connect the chip pad to the redistribution line pattern;

a second insulating layer covering the redistribution line pattern on the first insulating layer, the second insulating layer including a first part having a first thickness and a second part having a second thickness greater than the first thickness, the second part being disposed inwardly in the semiconductor package relative to the first part;

a first conductive pillar passing through the first part of the second insulating layer and connected to the redistribution line pattern; and a second conductive pillar passing through the second part of the second insulating layer and connected to the redistribution line pattern.

20. The semiconductor package as claimed in claim 19, further comprising:

a first connection terminal connected to the first conductive pillar and having a first size; and a second connection terminal connected to the second conductive pillar and having a second size that is smaller than the first size, wherein a lowermost end of the first connection terminal and a lowermost end of the second connection terminal are at a same level.

* * * * *